United States Patent
Tong et al.

(10) Patent No.: US 6,861,346 B2
(45) Date of Patent: *Mar. 1, 2005

(54) SOLDER BALL FABRICATING PROCESS

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/604,743

(22) Filed: Aug. 14, 2003

(65) Prior Publication Data

US 2004/0112944 A1 Jun. 17, 2004

Related U.S. Application Data

(63) Continuation of application No. 10/248,863, filed on Feb. 26, 2003, now Pat. No. 6,673,711.

(30) Foreign Application Priority Data

Feb. 27, 2002 (TW) .......................................... 91103530 A

(51) Int. Cl.$^7$ .......................... H01K 21/44; B23K 31/02
(52) U.S. Cl. ................... 438/613; 438/614; 228/180.22
(58) Field of Search .............................. 438/22, 26, 48, 438/50, 51, 54, 55, 106, 107, 108, 455, 584, 597, 612–615; 228/179.1, 180.21, 180.22; 29/832, 837, 838, 840, 842–845, 854, 857, 860, 861, 874–879

(56) References Cited

U.S. PATENT DOCUMENTS 6,673,711 B2 * 1/2004 Tong et al. ................. 438/613

* cited by examiner

Primary Examiner—Alonzo Chambliss
(74) Attorney, Agent, or Firm—Jiang Chyun IP Office

(57) ABSTRACT

A solder ball fabricating process for forming solder balls over a wafer having an active layer is provided. A patterned solder mask layer is formed over the active surface of the wafer. The patterned solder mask layer has an opening that exposes a bonding pad on the wafer. Solder material is deposited into the opening over the bonding pad. A reflow process is conducted to form a pre-solder body. The aforementioned steps are repeated so that various solder materials are fused together to form a solder ball over the bonding pad.

20 Claims, 4 Drawing Sheets

US 6,861,346 B2

SOLDER BALL FABRICATING PROCESS

CROSS REFERENCE TO RELATED APPLICATIONS

This application is a continuation of a prior application Ser. No. 10/248,863, filed Feb. 26, 2003, now U.S. Pat. No. 6,673,711, which claims the priority benefit of Taiwan application Ser. No. 91103530, filed on Feb. 27, 2002.

BACKGROUND OF INVENTION

1. Field of Invention

The present invention relates to a solder ball fabricating process. More particularly, the present invention relates to a solder ball fabricating process for the fabrication of a wafer-level chip scale package (WLCSP).

2. Description of Related Art

Due to the trend of developing light and compact electronic products, the size of most integrated circuit packages continues to decrease. To reduce the size of integrated circuit (IC) packages, chip scale packages (CSP) have been developed. In general, the edge length of a CSP package is roughly 1.2 times the edge length of a silicon chip or the chip/package has an area ratio of about 80% and the pitch between leads is limited to a value under 1 mm. Many types of chip scale packages are now available. However, the most common type is one having the package directly formed on the wafer, known also as a wafer-level chip scale package (WLCSP).

One major characteristics of a WLCSP is the fabrication of a redistribution circuit (RC) on the surface of the chip so that the bonding pads originally positioned around the periphery of the chip are redistributed as an area array on top of the chip. Hence, the entire surface of the chip can be utilized for accommodating bonding pads, thereby producing a larger pitch between bonding pads to meet the larger distance of separation between contacts on a printed circuit board (PCB). In addition, solder balls are attached to the bonding pads of the chip manually or automatically so that the bonding pads on the chip are electrically connected to the contacts on the PCB through the solder balls.

However, if the positions of the original bonding pads and pitch between the original bonding pads on the chip match the contact pitch in the printed circuit board, there is no need to form the redistribution circuit on the chip. In other words, the solder balls may be directly attached to the original bonding pads on the chip. In the following description, the solder ball pads refers to all the bonding pads on a chip requiring solder ball attachment, for example, including the original bonding pad on the chip or the bonding pads on the redistribution circuit above the chip.

As integrated circuit design progresses and the level of integration continues to increase, the number of output pads in a chip also increases. Yet, surface area of the chip often remains identical or is reduced slightly. Under such circumstances, the conventional solder ball attachment technique can hardly accommodate fine solder balls. Ultimately, small fine pitch solder balls have to be used in the fabrication of WLCSP.

Furthermore, the conventional solder ball attachment technique can be roughly classified into the automatic ball attachment method and the manual ball attachment method. The automatic ball attachment method costs more to operate especially for attaching small fine pitch solder ball. Although the manual ball attachment method is less expensive to operate, substantial labor force is required and overall ball attachment efficiency is relatively low. Since it is difficult to attach small fine pitch solder balls to the bonding pad of a chip in a WLCSP, a larger size bump is often attached to the bonding pad of the chip instead of a solder ball.

Because lead-tin alloy has a good bonding strength as well as physical and conductive properties, lead-alloy is often used as a solder material for joining devices on a chip with contacts on the printed circuit board in the fabrication of integrated circuit packages. However, lead is a toxic material that often causes health hazards and environmental concerns. Thus, the electronic industry is actively looking for a lead-free substitute for the lead-containing solder material. At present, a number of lead-free solder materials have already been developed. In the not too distant future, all lead-containing solder material will be replaced.

SUMMARY OF INVENTION

Accordingly, one object of the present invention is to provide a solder ball fabricating process for directly forming a solder ball on the bonding pad of a wafer in a wafer level chip scale package (WLCSP). The solder ball fabricating process not only increases production rate, but the size and height of the solder ball is also much easier to control within the desired range. In addition, constituents inside a lead-free solder ball are easier to control when the invention is applied to form lead-free solder balls.

To achieve these and other advantages and in accordance with the purpose of the invention, as embodied and broadly described herein, the invention provides a solder ball fabricating process for attaching at least one solder ball to a wafer. The wafer has an active surface, a passivation layer and at least one bonding pad. The passivation layer and the bonding pad are formed on the active surface of the wafer such that the passivation layer exposes the bonding pad. The wafer further includes a stress buffer layer and at least one under-ball-metallurgy layer. The under-ball-metallurgy layer is formed over the bonding pad. The stress buffer layer is formed over the passivation layer but also exposes the under-ball-metallurgy layer. First, a patterned first solder mask layer is formed over the stress buffer layer. The first solder mask has at least one first opening that exposes the under-ball-metallurgy layer. A first solder material is deposited into the first opening and then a first reflow process is carried out so that the first solder material inside the first opening is turned into a pre-solder body. Thereafter, a patterned second solder mask layer is formed over the first solder mask layer. The second solder mask layer has at least a second opening located above the first opening and exposing the pre-solder body. The second opening also has a diameter greater than the first opening. A second solder material is deposited into the second opening and then a second reflow process is carried out so that the second solder material inside the second opening and the pre-solder body melt together to form a solder ball above the under-ball-metallurgy layer. Finally, the first solder mask layer and the second solder mask layer are removed.

The solder ball fabricating process according to this invention includes forming a solder mask layer over the wafer and patterning the solder mask layer to form an opening. The opening exposes the under-ball-metallurgy layer above the bonding pad of the wafer. Thereafter, a solder material is deposited into the opening so that the solder material stacks on top of the under-ball-metallurgy layer. A reflow process is conducted next to melt the solder material into a pre-solder body. The aforementioned steps are repeated once so that various solder materials are melted into a solder ball above the bonding pad. Note that diameter of the opening in each solder mask layer may not be the same. Hence, a staircase-like or an inverted frustum-cone-like cavity structure is formed. This type of cavity structure facilitates the deposition of solder material into the opening. Therefore, solder ball having greater size and height are formed over the under-ball-metallurgy layer after the reflow of various solder materials is completed.

Similarly, the solder ball fabricating process according to this invention can be applied to fabricate lead-free solder balls. Since the constituents of a lead-free solder ball include metallic substances or alloys combined in various ratios, the lead-free solder balls are formed by sequentially stacking various types of solder materials over the bonding pads of the wafer and then melting the solder materials together. By adjusting the thickness of each solder mask layer and size of each opening, volume of solder material deposited into each opening can be precisely adjusted so that the ultimately formed lead-free solder ball has the desired height and contains all the necessary constituents mixed in the desired ratio.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
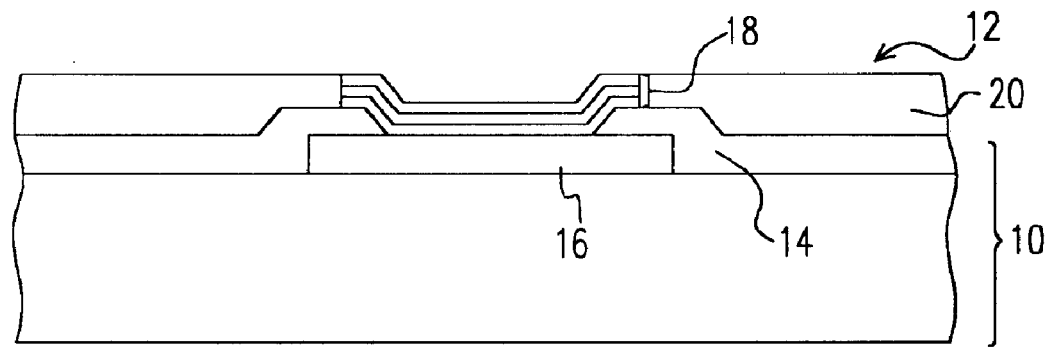
FIGS. 1 to 8 are schematic cross-sectional views showing the steps carried out in a solder ball fabricating process according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 to 8 are schematic cross-sectional views showing the steps carried out in a solder ball fabricating process according to one preferred embodiment of this invention. As shown in FIG. 1, a wafer having an active surface 12, a passivation layer 14 and a plurality of solder ball pads 16 (only one is shown) is provided. The passivation layer 14 and the solder ball pads 16 are formed on the active surface 12 of the wafer such that the passivation layer 14 exposes the solder ball pad 16. The solder ball pad 16 refers to any bonding pads or connection pads on the wafer 10. The wafer 10 further includes a plurality of under-ball-metallurgy (UBM) layers 18 (only one is shown) and a stress buffer layer 20. The under-ball-metallurgy layer 18 is formed over the solder ball pad 16 and the stress buffer layer 20 is formed over the passivation layer 14. The stress buffer layer 20 also exposes the under-ball-metallurgy layer 18.

The wafer 10 may be packaged according to a chip scale package (CSP) so that a chip cut out from a wafer is mounted onto a carrier. Damages to the chip and other package structures may occur due to thermal stress resulting from differences in the coefficient of thermal expansion (CTE) between the chip and the carrier. The stress buffer layer 20 is used to buffer the thermal stress between the chip and the carrier so that structural damage between the chip and the carrier is minimized. The stress buffer layer is commonly fabricated using a material such as benzocyclobutene (BCB).

Figure 7:
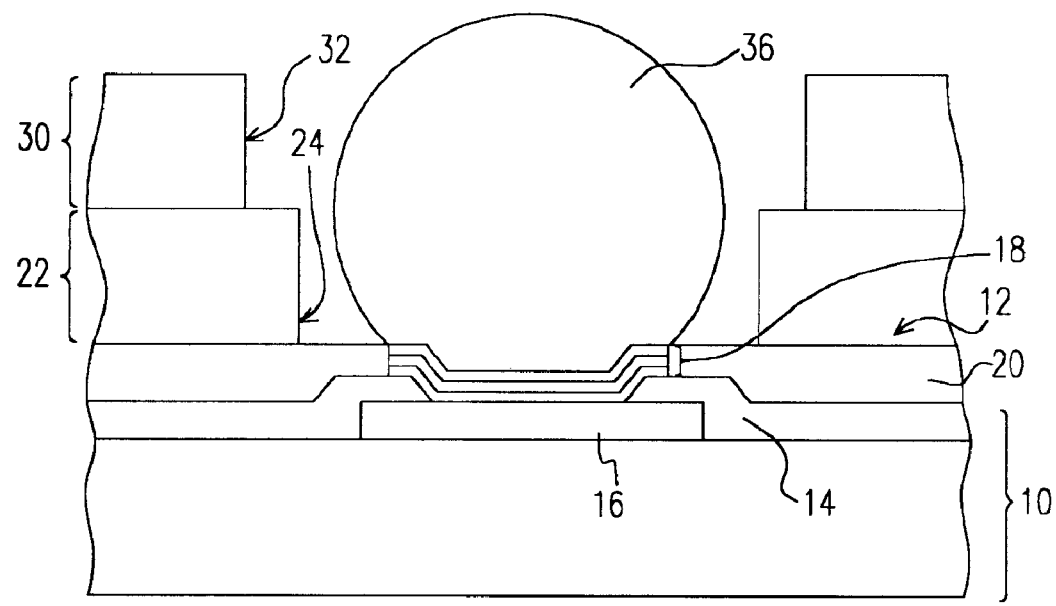
Figure 8:
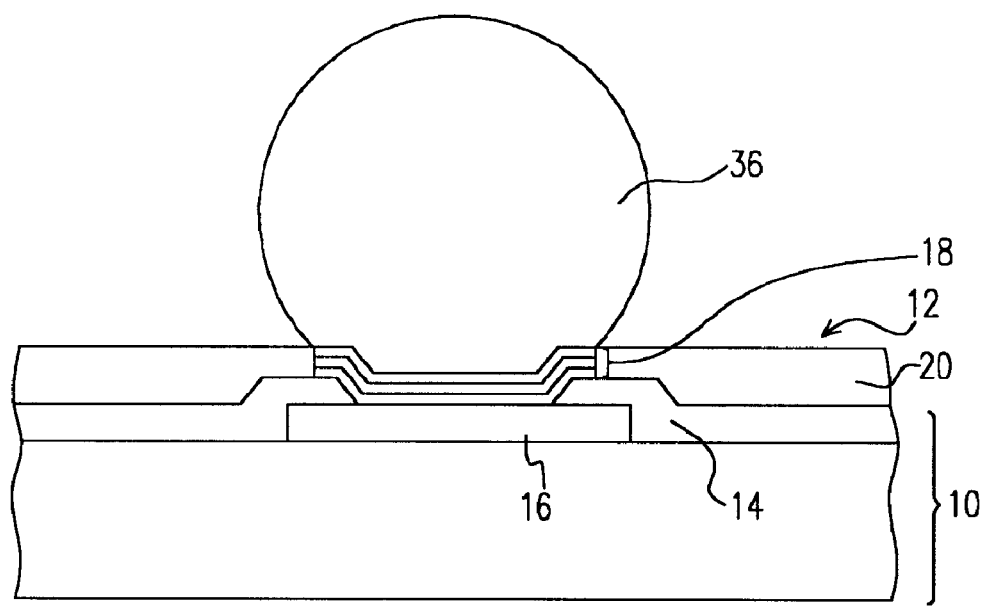

The under-ball-metallurgy layer 18 is designed to increase the bonding strength between a solder ball 34 and the solder ball pad 16 as shown in FIG. 7. In the meantime, the under-ball-metallurgy layer 18 also serves to prevent the inter-diffusion of metallic elements and avoid the oxidation of metallic layers. The under-ball-metallurgy layer 18 is usually formed before the stress buffer layer 20. Photolithographic process together with evaporation, sputtering or electroplating processes are often used to fabricate the under-ball-metallurgy layer 18. An alternative method of forming the under-ball-metallurgy layer 18 is to form an under-ball-metallurgy layer over the active surface 12 of the wafer 10 globally and performing photolithographic and etching process in sequence to pattern the under-ball-metallurgy layer. Furthermore, the under-ball-metallurgy layer typically includes a stack of metallic layers such as a wetting layer, a barrier layer and an adhesion layer. These metallic layers are fabricated using a single type of metal such as copper, chromium, titanium, tungsten, silver, nickel, vanadium and aluminum or an alloy of some of the above metals.

Figure 2:
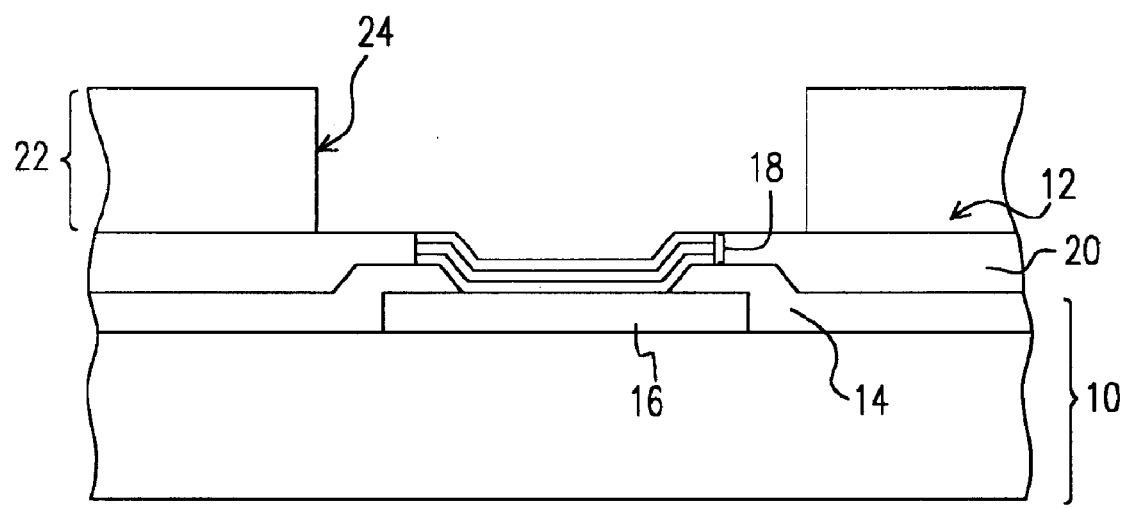

As shown in FIG. 2, a patterned first solder mask layer 22 is formed over the stress buffer layer 20. The patterned first solder mask layer 22 has a plurality of first openings 24 (only one is shown). The patterned first solder mask layer 22 is formed in a lamination process, for example. In the lamination process, a photosensitive dry film is adhered to the surface of the stress buffer layer 20. Alternatively, the patterned first solder mask layer 22 is formed by spin-coating liquid photoresist on the stress buffer layer 20. Thereafter, using a photo-via method, the photosensitive dry film or the photoresist layer is patterned to form a first opening 24 in the first solder mask layer 22. Thickness of the first solder mask layer 22 determines the height of the first opening 24.

Figure 3:
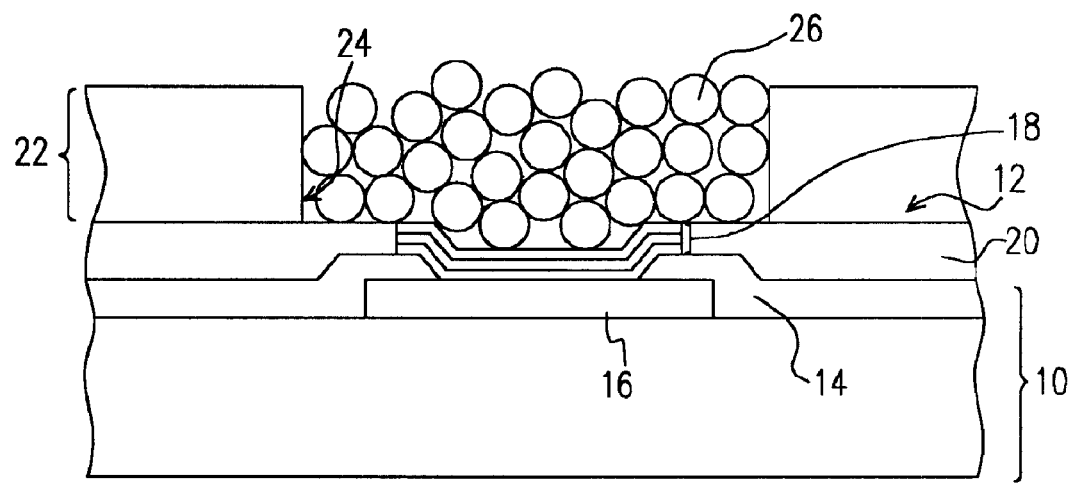

As shown in FIG. 3, a printing method is applied to deposit a first type of solder material 26 into the first opening 24. The first solder material in solder powder form or solder paste form accumulates over the under-ball-metallurgy layer 18 inside the first opening 24.

Figure 4:
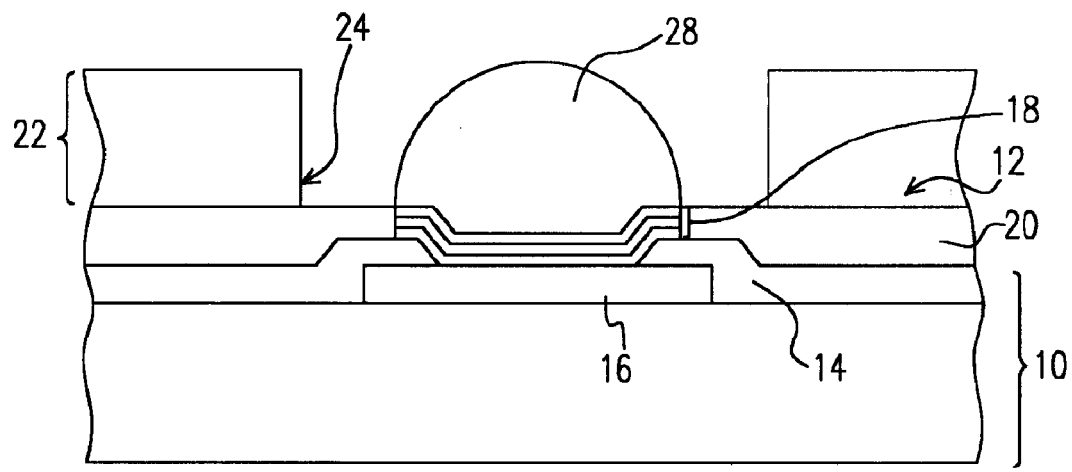

As shown in FIG. 4, a first reflow process is conducted so that the first solder material 26 is transformed into a pre-solder body 28 on top of the under-ball-metallurgy layer 18.

Figure 5:
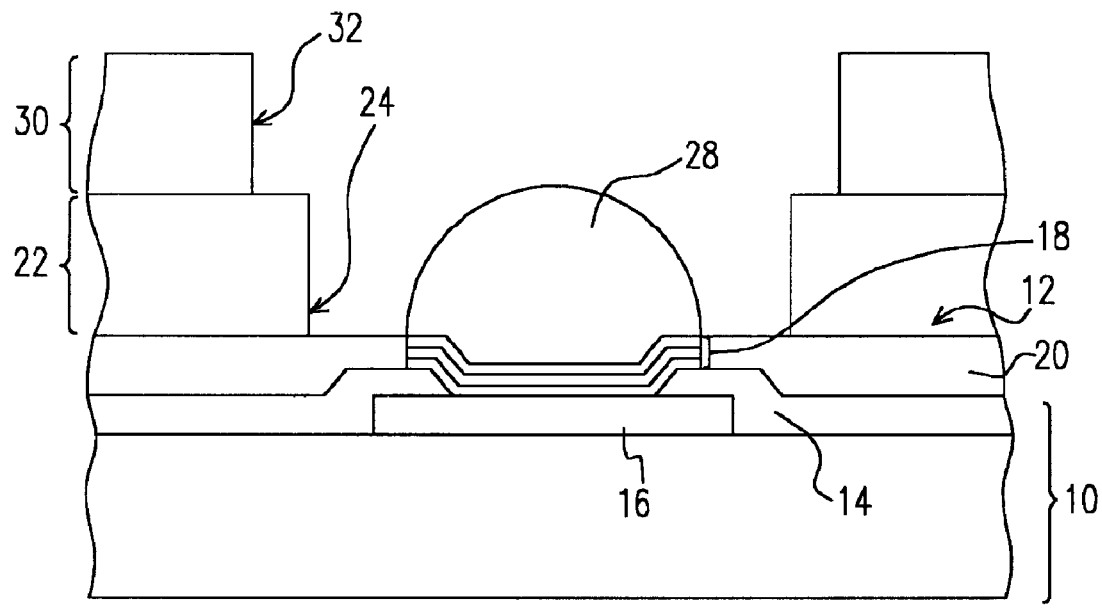

As shown in FIG. 5, a patterned second solder mask layer 30 is formed over the first solder mask layer 22. The second solder mask layer has a plurality of second openings 32 (only one is shown) that exposes corresponding pre-solder body 28. Since the second solder mask 30 is formed and patterned in way similar to the first solder mask 22, detailed description of the steps is omitted here.

Figure 6:
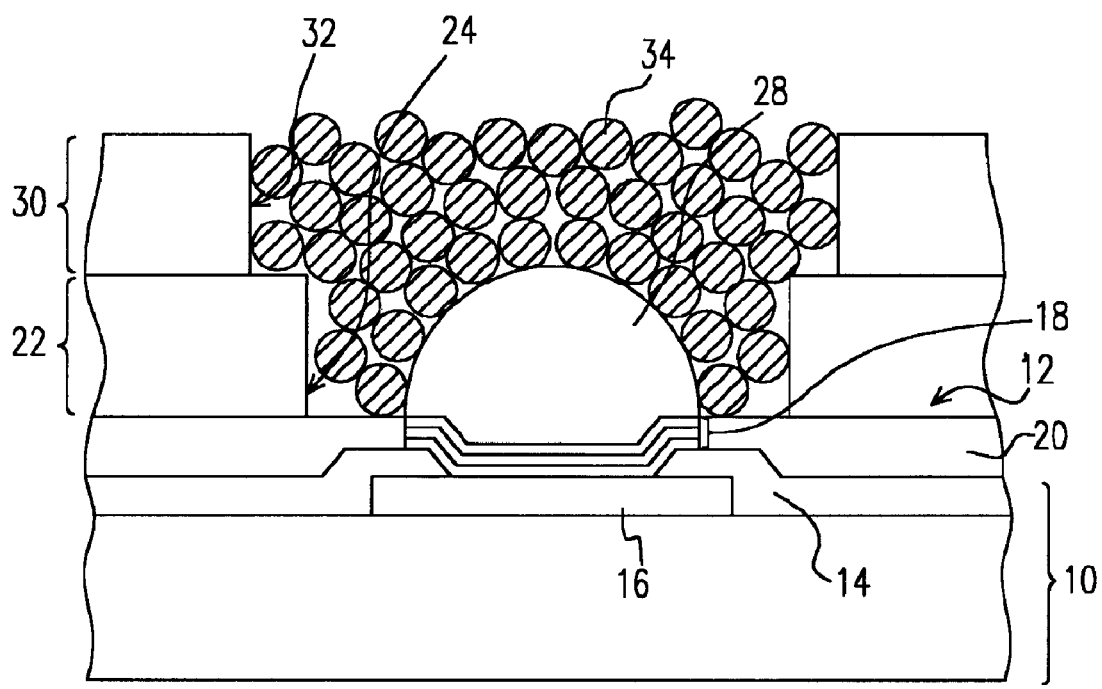

As shown in FIG. 6, a printing method is similarly applied to deposit a second type of solder material 34 into the second opening 32. The second solder material 34 also in solder powder form or solder paste form accumulates over the pre-solder body 28 (formed from the first solder material 26) inside the second opening 32. The second solder material 34 may contain the same material as the pre-solder body 28 (that is, the first solder material 26) or different constituents. Note that the second opening 32 has a diameter larger than the first opening 24. Consequently, the first opening 24 together with the second opening 32 form a staircase-like or inverted frustum-cone-like cavity structure that facilitates the deposition of the second solder material 34.

As shown in FIG. 7, a second reflow process is carried out to melt and fuse the pre-solder body 28 and the second solder material 34 together and form a bigger solder ball 36 over the under-ball-metallurgy layer 18. Finally, the first solder mask layer 22 and the second masking layer 30 are removed to expose the solder ball 36 to form a structure shown in FIG. 8.

The solder ball fabricating process according to this invention can also be applied to the fabrication of lead-free solder balls as shown in FIGS. 6 and 7. For example, if pre-solder body 28 (the first solder material 26) is a tin-silver alloy (95 Sn/5 Ag) and the second solder material 34 is tin, the solder ball 36 after a reflow process is a tin-rich tin-silver alloy solder ball. On the other hand, if the pre-solder body 28 (the first solder material 26) is copper and the second solder material 34 is tin, the solder ball 36 after a reflow process is a tin-copper alloy solder ball. If the pre-solder body 28 (the first solder material 26) is silver and the second solder material 34 is tin, the solder ball 36 after a reflow process is a tin-silver alloy solder ball. Similarly, if pre-solder body 28 (the first solder material 26) is a tin-silver alloy (95 Sn/5 Ag) and the second solder material 34 is copper, the solder ball 36 after a reflow process is a tin-silver-copper alloy solder ball.

Similarly, as shown in FIGS. 6 and 7, the solder ball 37 on the wafer 10 has a diameter of about 400 μm. To form a solder ball having such a size, an under-ball-metallurgy layer 18 having a diameter of about 150 μm, a first opening 24 having a width of about 700 μm and a second opening 32 having a width of about 900 μm, for example, are fabricated.

The solder ball fabricating process according to this invention includes forming a patterned solder mask layer over the wafer. The patterned solder mask layer contains openings that expose solder ball pads on the wafer. A solder material is then deposited into the openings and a reflow process is carried out to form pre-solder body inside each opening. A second patterned solder mask layer having openings therein is formed over the first solder mask layer. The second openings expose the original pre-solder body. Thereafter, a second type of solder material is deposited into the second opening to accumulate over the pre-solder body. A second reflow process is conducted to melt and fuse the two types of solder materials into a single solder ball over the solder ball pad (or the under-ball-metallurgy layer).

Aside from forming two patterned solder mask layers, this invention also permits a repetition of the aforementioned steps to form more patterned solder mask layers. Each repetition includes forming a patterned solder mask layer, filling the opening with solder material and conducting a reflow process to form a pre-solder body. Finally, the stack of solder materials are melted and fused together to form a solder ball over the solder ball pad (the under-ball-metallurgy layer).

This invention also utilizes the openings in various solder mask layers to form a staircase-like or inverted frustum-cone-like cavity structure that facilitates the deposition of solder material and provides sufficient support to present the collapse of the pre-solder body during a reflow process. Hence, size and height of the solder ball can be significantly increased to meet design criteria.

In summary, the solder ball fabricating process according to this invention includes forming a solder mask layer on the active surface of a wafer and patterning the solder mask layer to form an opening. The opening exposes the under-ball-metallurgy layer above the solder ball pad of the wafer. Thereafter, a solder material is deposited into the opening and a reflow process is conducted next to melt the solder material into a pre-solder body. The aforementioned steps are repeated once so that various solder materials are melted into a solder ball above the bonding pad. Since the openings in various solder mask layers together form a staircase-like or an inverted frustum-cone-like cavity structure, a wider area for accepting the deposition of solder material is provided. Thus, solder balls having a greater size and height can be produced over the under-ball-metallurgy layer to meet various designs.

In addition, the solder ball fabricating process of this invention can be used to form solder bumps over a wafer. In this case, the solder material deposited into the openings must have good soldering properties. Due to environmental and health considerations, lead-containing solder material (such as lead-tin alloy) is likely to phase out soon. Ultimately, lead-free solder ball will have to be fabricated.

The solder ball fabricating process according to this invention can be applied to the fabrication of lead-free solder balls. Since the constituents of a lead-free solder ball include metallic substances or alloys combined in various ratios, the lead-free solder ball is formed by sequentially stacking various types of solder materials over the bonding pads of the wafer and then melting the solder materials together. By adjusting the thickness of each solder mask layer and size of each opening, the volume of solder material deposited into each opening can be precisely adjusted so that the ultimately formed lead-free solder ball has the desired height and contains all the necessary constituents mixed in the desired ratio.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solder ball fabricating process for producing at least one solder ball on a wafer, the method comprising:

forming a structured layer over the wafer, wherein the structure layer includes at least an under-ball-metallurgy layer being exposed;

forming a first patterned solder mask layer over the structured layer, wherein the first patterned solder mask layer has at least a first opening that exposes the under-ball-metallurgy layer;

depositing a first solder material into the first opening;

conducting a first reflow process so that the first solder material melts to form a pre-solder body over the under-ball-metallurgy layer;

forming a second patterned solder mask layer over the first patterned solder mask layer, wherein the second patterned solder mask layer has at least one second opening corresponding to the first opening to expose the pre-solder body and the second opening is larger than the first opening in an opening size;

depositing a second solder material into the second opening;

conducting a second reflow process so that the pre-solder body and the second solder material melt and fuse together to form a solder ball over the under-ball-metallurgy layer; and removing the first solder mask layer and the second solder mask layer.

2. The process of claim 1, wherein the first solder material and the second solder material are identical.

3. The process of claim 1, wherein the first solder material is different from the second solder material.

4. The process of claim 1, wherein the first solder material has a melting point higher than that of the second solder material.

5. The process of claim 1, wherein the solder ball is a lead-containing solder ball.

6. The process of claim 1, wherein the solder ball is a lead-free solder ball.

7. The process of claim 1, wherein the first patterned solder mask layer includes a photoresist layer.

8. The process of claim 1, wherein the first patterned solder mask layer includes a dry film.

9. The process of claim 1, wherein the step of forming the second patterned solder mask layer includes laminating a mask layer over the first patterned solder mask layer and then patterning the second solder mask layer.

10. The process of claim 1, wherein the step of forming the second patterned solder mask layer includes spin-coating a mask layer over the first patterned solder mask layer and then patterning the second solder mask layer.

11. The process of claim 1, wherein the first solder material is a solder powder or a solder paste.

12. The process of claim 1, wherein the second solder material is a solder powder or a solder paste.

13. The process of claim 1, wherein the step of forming the structured layer comprises forming a redistribution layer to redistribute a bond pad of a chip to the under-ball-metallurgy layer.

14. The process of claim 1, wherein the under-ball-metallurgy layer is disposed and electrically connected to a bond pad of a chip.

15. A solder ball fabricating process for producing at least one solder ball on a wafer, the method comprising:

forming a structured layer over the wafer, wherein the structure layer includes at least an under-ball-metallurgy layer being exposed;

forming a first patterned solder mask layer over the structured layer, wherein the first patterned solder mask layer has at least a first opening that exposes the under-ball-metallurgy layer;

forming a second patterned solder mask layer over the first patterned solder mask layer, wherein the second patterned solder mask layer has at least one second opening corresponding to the first opening and the second opening is larger than the first opening in opening size;

depositing a first solder material into the first opening;

depositing a second solder material into the second opening;

conducting a reflow process on the foregoing solder materials within the forgoing openings to form a solder ball over the under-ball-metallurgy layer; and removing the forgoing solder mask layers.

16. The process of claim 15, wherein before the step of forming the second patterned solder mask layer, the step of depositing the first solder material into the first opening is performed and a pre-reflow process is performed on the first solder material.

17. The process of claim 15, wherein the step of forming the structured layer comprises forming a redistribution layer to redistribute a bond pad of a chip to the under-ball-metallurgy layer.

18. The process of claim 15, wherein the under-ball-metallurgy layer is disposed and electrically connected to a bond pad of a chip.

19. The process of claim 15, wherein the first solder material is different from the second solder material.

20. The process of claim 15, before the step of conducting the reflow process, further comprising:

forming a third patterned solder mask layer with a third opening over the second patterned solder masks, wherein the third opening is aligned to the second opening and is larger in open size than the second opening; and depositing a third solder material into the third opening.

* * * * *